(12) United States Patent
Lee

(10) Patent No.: US 12,356,569 B2
(45) Date of Patent: Jul. 8, 2025

(54) ELECTRONIC DEVICE FOR MOVING FLEXIBLE PRINTED CIRCUIT BOARD ALONG SUPPORT PLATE DURING UNFOLDING OPERATION

(71) Applicant: SAMSUNG ELECTRONICS CO., LTD., Suwon-si (KR)

(72) Inventor: Youngsun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 126 days.

(21) Appl. No.: 17/903,405

(22) Filed: Sep. 6, 2022

(65) Prior Publication Data
US 2023/0040036 A1    Feb. 9, 2023

Related U.S. Application Data

(63) Continuation of application No. PCT/KR2022/011093, filed on Jul. 28, 2022.

(30) Foreign Application Priority Data

Aug. 3, 2021    (KR) .................. 10-2021-0102111

(51) Int. Cl.
*H05K 5/02*    (2006.01)
*F16C 11/04*    (2006.01)
*H04M 1/02*    (2006.01)

(52) U.S. Cl.
CPC ............ *H05K 5/0226* (2013.01); *F16C 11/04* (2013.01); *H04M 1/022* (2013.01);
(Continued)

(58) Field of Classification Search
None
See application file for complete search history.

(56) References Cited

U.S. PATENT DOCUMENTS

2012/0257368 A1*   10/2012   Bohn ................... H04M 1/022
                                                      16/319
2013/0163158 A1*   6/2013    Sano ................... H04M 1/0237
                                                      361/679.01
(Continued)

FOREIGN PATENT DOCUMENTS

CN    210168069    3/2020
KR    10-0504138    7/2005
(Continued)

OTHER PUBLICATIONS

Search Report dated Oct. 25, 2022 issued in International Patent Application No. PCT/KR2022/011093.
(Continued)

*Primary Examiner* — James Wu
*Assistant Examiner* — Christopher L Augustin
(74) *Attorney, Agent, or Firm* — NIXON & VANDERHYE P.C.

(57) ABSTRACT

According to various example embodiments, a foldable electronic device configured to move a flexible printed circuit board along a support plate during an unfolding operation may include: a hinge configured to support a flexible printed circuit board, wherein the hinge may include: a hinge body, a support plate rotatably connected to the hinge body, a slider slidable along the support plate and configured to support the flexible printed circuit board, and a connecting part configured to connect the support plate and a connecting plate.

20 Claims, 11 Drawing Sheets

(52) U.S. Cl.
CPC ....... *H04M 1/0237* (2013.01); *H04M 1/0268* (2013.01); *H04M 1/0277* (2013.01)

(56) References Cited

U.S. PATENT DOCUMENTS

2018/0324964 A1*  11/2018  Yoo ........................ H05K 1/189
2020/0396852 A1   12/2020  Yoo et al.

FOREIGN PATENT DOCUMENTS

| KR | 10-2015-0130652 | 11/2015 |
| KR | 10-2019-0065641 | 6/2019 |
| KR | 10-2068602 | 1/2020 |
| KR | 10-2020-0021172 | 2/2020 |
| KR | 10-2020-0099612 | 8/2020 |
| KR | 10-2020-0103111 | 9/2020 |
| KR | 10-2178724 | 11/2020 |
| KR | 10-2021-0019095 | 2/2021 |
| WO | 2021/129882 | 7/2021 |

OTHER PUBLICATIONS

Extended European Search Report dated Oct. 2, 2024 for EP Application No. 22853347.7.

* cited by examiner

ELECTRONIC DEVICE FOR MOVING FLEXIBLE PRINTED CIRCUIT BOARD ALONG SUPPORT PLATE DURING UNFOLDING OPERATION

CROSS-REFERENCE TO RELATED APPLICATIONS

This application is a continuation of International Application No. PCT/KR2022/011093 designating the United States, filed on Jul. 28, 2022, in the Korean Intellectual Property Receiving Office and claiming priority to Korean Patent Application No. 10-2021-0102111, filed on Aug. 3, 2021, in the Korean Intellectual Property Office, the disclosures of which are incorporated by reference herein in their entireties.

BACKGROUND

1. Field

The disclosure relates to a foldable electronic device, for example, an electronic device for moving a flexible printed circuit board along a support plate during an unfolding operation.

2. Description of Related Art

A foldable electronic device may include a flexible display, a first housing and a second housing supporting the flexible display, and a hinge rotatably supporting the first housing and the second housing. The hinge may support a flexible printed circuit board (FPCB). The FPCB may be deformed as the first housing and the second housing move. For example, the FPBC may be deformed into an "S" shape approximately.

As a method of expanding an internal space of the foldable electronic device, a technique for reducing the size of the hinge is considered. As the size of the hinge decreases, a degree of deformation of the FPCB in the hinge may increase. For example, a curvature of the FPCB may increase. As the degree of deformation of the FPCB increases, stress applied to the FPCB may increase.

When the size of the hinge decreases, the size of the FPCB may relatively increase, compared to the size of the hinge, and thus, a curvature of the FPCB may increase when the first housing and the second housing are in an unfolded state. When the curvature of the FPCB increases, a crack may occur in the FPCB due to bending fatigue.

On the other hand, when decreasing a length of the FPCB to decrease cracks from occurring, the FPCB may be caught on a component of the hinge when the first housing and the second housing are in a folded state. When the FPCB is caught by the component of the hinge, a crack may occur in the FPCB.

SUMMARY

Embodiments of the disclosure may provide an electronic device that may reduce stress on a bending portion of the FPCB and prevent and/or reduce a crack in a connecting portion of a circuit by moving the FPCB with respect to a support plate.

According to various example embodiments, an electronic device configured to move a flexible printed circuit board (FPCB) during an unfolding operation may include: a hinge; a first housing and a second housing both rotatably connected to the hinge; a display deformable based on movements of the first housing and the second housing; and the FPCB provided at the inside of the first housing and the second housing, wherein the hinge may include: a hinge body; a first support plate rotatably connected to the hinge body based on the first rotation axis and connected to the first housing; a second support plate rotatably connected to the hinge body, and connected to the second housing; a first slider slidable along the first support plate and configured to support one side of the FPCB; and a second slider slidable along the second support plate and configured to support the other side of the FPCB.

According to various example embodiments, an electronic device configured to move a flexible printed circuit board (FPCB) along a support plate during an unfolding operation may include: a hinge configured to support the FPCB, wherein a hinge may include a hinge body; a support plate rotatably connected to the hinge body; a slider slidable along the support plate and configured to support the FPCB; and a connecting part connecting the support plate and the connecting plate.

According to various example embodiments, an electronic device configured to move a flexible printed circuit board (FPCB) along a support plate during an unfolding operation may include: a hinge; a first housing and a second housing rotatably connected to the hinge; a display disposed on the first housing and the second housing and deformable based on movement of the first housing and the second housing; an FPCB provided at an inside of the first housing and the second housing, wherein the hinge may include: a hinge body; a first support plate rotatably connected to the hinge body based on a first rotation axis, and connected to the first housing; a second support plate rotatably connected to the hinge body based on a second rotation axis, and connected to the second housing; a first slider slidable along the first support plate and configured to support one side of the FPCB; a second slider slidable along the second support plate and configured to support the other side of the FPCB; a first connecting part configured to connect the first support plate and the first slider; a second connecting part configured to connect the second support plate and the second slider; a first guide plate rotatably connected to the hinge body based on a third rotation axis and configured to support the first slider; and a second guide plate rotatably connected to the hinge body based on a fourth rotation axis and configured to support the second slider.

The electronic device according to various example embodiments of the present disclosure may move the flexible printed circuit board with respect to the support plate during the unfolding operation.

The electronic device according to various example embodiments of the present disclosure may reduce the curvature of the flexible printed circuit board in an unfolded state by allowing both ends of the flexible printed circuit board to move away from each other during the unfolding operation, and may reduce an intensity of stress applied to the flexible printed circuit board.

In addition, various effects directly or indirectly ascertained through the present disclosure may be provided.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
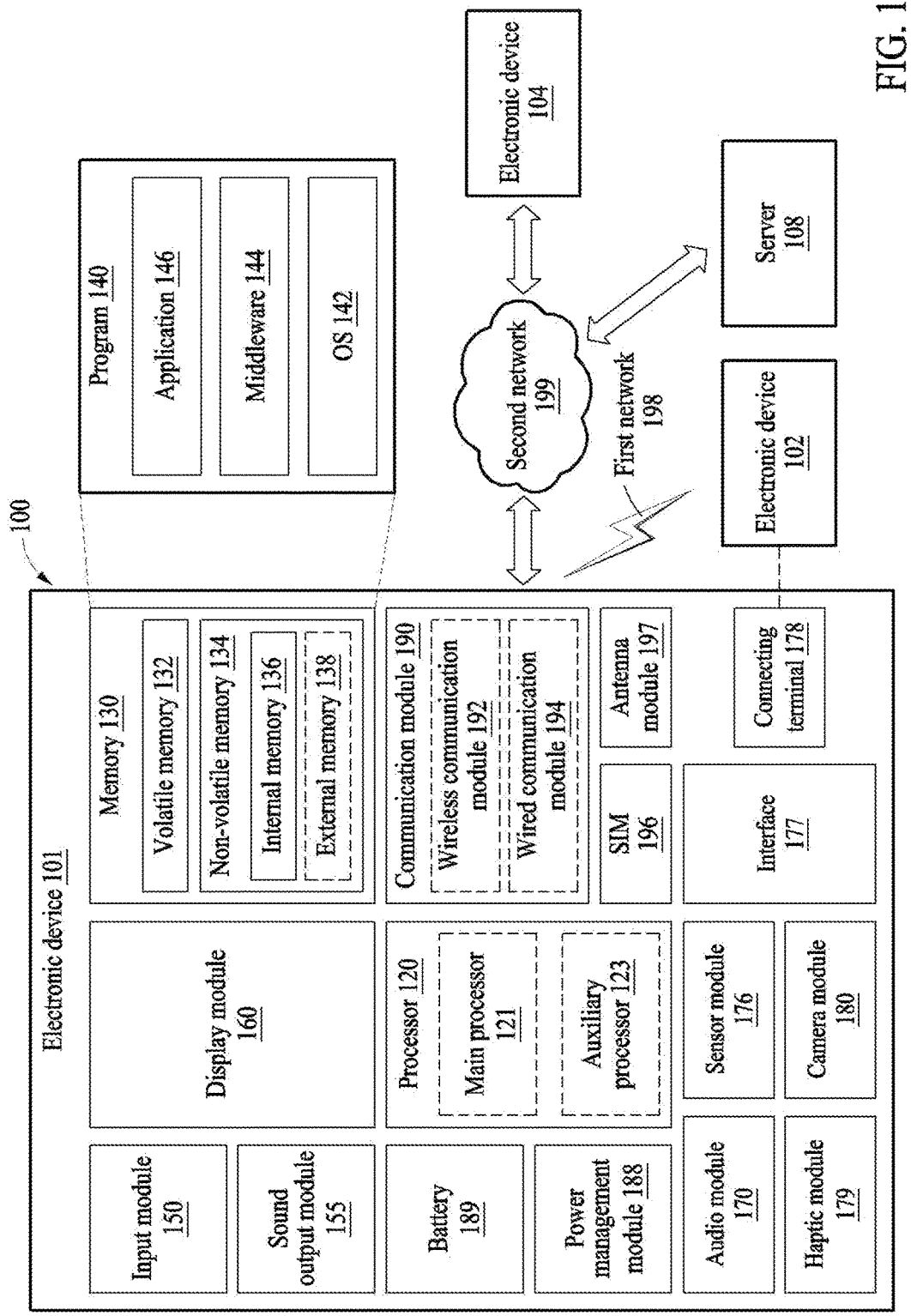
FIG. 1 is a block diagram illustrating an example electronic device in a network environment according to various embodiments.

Hereinafter, various example embodiments will be described in greater detail with reference to the accompanying drawings. When describing the example embodiments with reference to the accompanying drawings, like reference numerals refer to like elements and a repeated description related thereto may not be provided.

FIG. 1 is a block diagram illustrating an example electronic device 101 in a network environment 100 according to various example embodiments. Referring to FIG. 1, the electronic device 101 in the network environment 100 may communicate with an electronic device 102 via a first network 198 (e.g., a short-range wireless communication network), or communicate with at least one of an electronic device 104 or a server 108 via a second network 199 (e.g., a long-range wireless communication network). According to an example embodiment, the electronic device 101 may communicate with the electronic device 104 via the server 108. According to an example embodiment, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various example embodiments, at least one (e.g., the connecting terminal 178) of the above components may be omitted from the electronic device 101, or one or more other components may be added in the electronic device 101. In various example embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to an example embodiment, as at least a part of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an example embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently of, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is in an active state (e.g., executing an application). According to an example embodiment, the auxiliary processor 123 (e.g., an ISP or a CP) may be implemented as a portion of another component (e.g., the camera module 180 or the communication module 190) that is functionally related to the auxiliary processor 123. According to an example embodiment, the auxiliary processor 123 (e.g., an NPU) may include a hardware structure specified for artificial intelligence (AI) model processing. An AI model may be generated by machine learning. Such learning may be performed by, for example, the electronic device 101 in which an artificial intelligence model is executed, or performed via a separate server (e.g., the server 108). Learning algorithms may include, but are not limited to, for example, supervised learning, unsupervised learning, semi-supervised learning, or reinforcement learning. The artificial intelligence model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The artificial intelligence model may additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 and an external memory 138.

The program 140 may be stored as software in the memory 130, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. According to an example embodiment, the receiver may be implemented separately from the speaker or as a part of the speaker.

The display module 160 may visually provide information to the outside (e.g., a user) of the electronic device 101. The display module 160 may include, for example, a control circuit for controlling a display, a hologram device, or a projector and control circuitry to control a corresponding one of the display, the hologram device, and the projector. According to an example embodiment, the display device 160 may include a touch sensor adapted to sense a touch, or a pressure sensor adapted to measure an intensity of a force incurred by the touch.

The audio module 170 may convert a sound into an electric signal or vice versa. According to an example embodiment, the audio module 170 may obtain the sound via the input device 150 or output the sound via the sound output device 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electric signal or data value corresponding to the detected state. According to an example embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an example embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to an example embodiment, the connecting terminal 178 may include, for example, an HDMI connector, a USB connector, an SD card connector, or an audio connector (e.g., a headphone connector).

The haptic module 179 may convert an electric signal into a mechanical stimulus (e.g., a vibration or a movement) or an electrical stimulus which may be recognized by a user via his or her tactile sensation or kinesthetic sensation. According to an example embodiment, the haptic module 179 may include, for example, a motor, a piezoelectric element, or an electric stimulator.

The camera module 180 may capture a still image and moving images. According to an example embodiment, the camera module 180 may include one or more lenses, image sensors, ISPs, or flashes.

The power management module 188 may manage power supplied to the electronic device 101. According to an example embodiment, the power management module 188 may be implemented as, for example, at least a part of a power management integrated circuit (PMIC).

The battery 189 may supply power to at least one component of the electronic device 101. According to an example embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to an example embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to an example embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an example embodiment, the antenna module 197 may include an antenna including a radiating element including a conductive material or a conductive pattern formed in or on a substrate (e.g., a printed circuit board (PCB)). According to an example embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. According to an example embodiment, another component (e.g., a radio frequency integrated circuit (RFIC)) other than the radiating element may be additionally formed as a part of the antenna module 197.

According to various example embodiments, the antenna module 197 may form a mmWave antenna module. According to an example embodiment, the mmWave antenna module may include a PCB, an RFIC disposed on a first surface (e.g., a bottom surface) of the PCB or adjacent to the first surface and capable of supporting a designated high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an example embodiment, commands or data may be transmitted or received between the electronic device 101 and the external electronic device 104 via the server 108 coupled with the second network 199. Each of the external electronic devices 102 or 104 may be a device of the same type as or a different type from the electronic device 101. According to an example embodiment, all or some of operations to be executed by the electronic device 101 may be executed at one or more of the external electronic devices 102, 104, and 108. For example, if the electronic device 101 needs to perform a function or a service automatically, or in response to a request from a user or another device, the electronic device 101, instead of, or in addition to, executing the function or the service, may request one or more external electronic devices to perform at least part of the function or the service. The one or more external electronic devices receiving the request may perform the at least part of the function or the service requested, or an additional function or an additional service related to the request, and may transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another example embodiment, the external electronic device 104 may include an Internet-of-things (IoT) device. The server 108 may be an intelligent server using machine learning and/or a neural network. According to an example embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various example embodiments may be one of various types of electronic devices. The electronic device may include, for example, a portable communication device (e.g., a smartphone), a computer device, a portable multimedia device, a portable medical device, a camera, a wearable device, a home appliance device, or the like. According to an example embodiment of the disclosure, the electronic device is not limited to those described above.

It should be appreciated that various example embodiments of the present disclosure and the terms used therein are not intended to limit the technological features set forth herein to particular embodiments and include various changes, equivalents, or replacements for a corresponding embodiment. In connection with the description of the drawings, like reference numerals may be used for similar or related components. It is to be understood that a singular form of a noun corresponding to an item may include one or more of the things, unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question, and may refer to components in other aspects (e.g., importance or order) is not limited. It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various example embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an example embodiment, the module may be implemented in a form of an application-specific integrated circuit (ASIC).

Various example embodiments as set forth herein may be implemented as software (e.g., the program 140) including one or more instructions that are stored in a storage medium (e.g., an internal memory 136 or an external memory 138) that is readable by a machine (e.g., the electronic device 101) For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an example embodiment, a method according to various example embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various example embodiments, each component (e.g., a module or a program) of the above-described components may include a single entity or multiple entities, and some of the multiple entities may be separately disposed in different components. According to various example embodiments, one or more of the above-described components may be omitted, or one or more other components may be added. Alternatively or additionally, a plurality of components (e.g., modules or programs) may be integrated into a single component. In such a case, according to various example embodiments, the integrated component may still perform one or more functions of each of the plurality of components in the same or similar manner as they are performed by a corresponding one of the plurality of components before the integration. According to various example embodiments, operations performed by the module, the program, or another component may be carried out sequentially, in parallel, repeatedly, or heuristically, or one or more of the operations may be executed in a different order or omitted, or one or more other operations may be added.

Figure 2A:
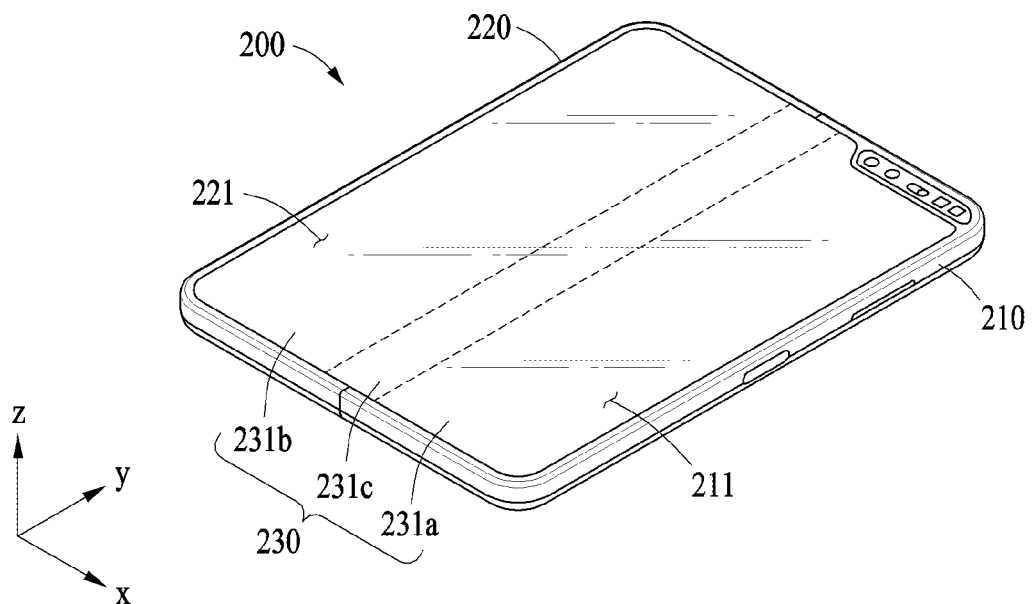
FIGS. 2A and 2B are perspective views of various use states of a foldable electronic device according to various embodiments.
Figure 2B:
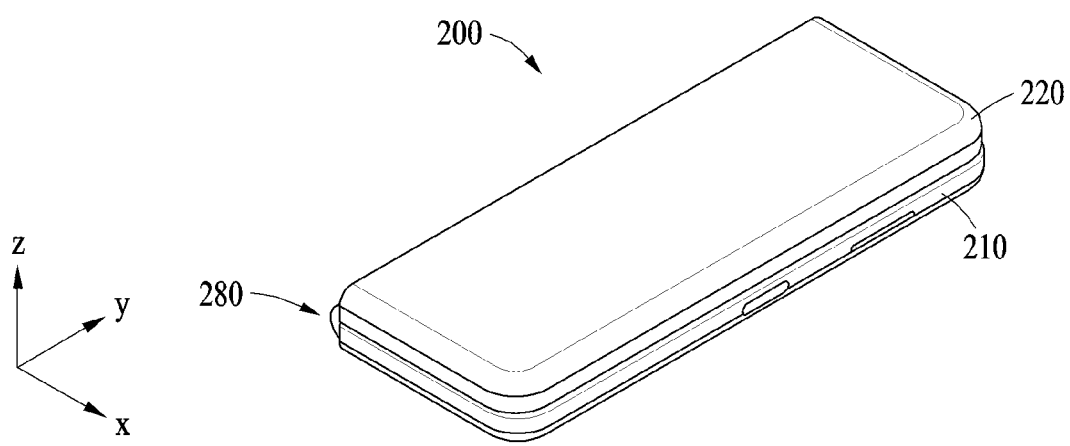

FIGS. 2A and 2B are perspective views illustrating various use states of a foldable electronic device according to various embodiments.

Referring to FIGS. 2A and 2B, a shape of an electronic device 200 (e.g., the electronic device 101 of FIG. 1) may differ based on a use state. For example, the electronic device 200 may be provided in a foldable type that may be folded or unfolded according to the use state. In an example embodiment, the electronic device 200 may include a first housing 210, a second housing 220, a display 230, and a hinge 280.

The display 230 may display visual information to a user. In an example embodiment, at least a portion of the display 230 may be deformed to a flat surface or a curved surface such that a shape of the display 230 may be deformed in response to shape deformation of the electronic device 200 (e.g., an opening/closing operation of the electronic device 200 between an open state of FIG. 2A and a closed state of FIG. 2B). In an example embodiment, the display 230 may include a folding area 231c, a first area 231a disposed on one side (e.g., a right area of the folding area 231c of FIG. 2A) of the folding area 231c, and a second area 231b disposed on the other side (e.g. a left area of the folding area 231c of FIG. 2A) of the folding area 231c. In an example embodiment, an overall shape of the display 230 may be deformed in response to the opening and/or closing operation of the electronic device 200 as a relative angle formed by the first area 231a and the second area 231b is adjusted by the folding area 231c. For example, a shape of the display 230 may be deformed to be in a first state (e.g., an unfolded state of FIG. 2A) in which the first area 231a and the second area 231b form substantially the same plane, an intermediate state in which the first area 231a and the second area 231b form a predetermined angle, or a second state (e.g., a folded state of FIG. 2B) in which the first area 231a and the second area 231b face each other.

In an example embodiment, the first area 231a and the second area 231b may have generally symmetrical shapes with respect to the folding area 231c. However, the first area 231a or the second area 231b may include a notch area that is partially cut by another component, which is exposed on the front surface of the electronic device 200, and thus, a portion of the first area 231a or the second area 231b may be asymmetrical. However, the areal division of the display 230 described above is an example, and the display 230 may be divided into a plurality of areas according to functions and structures required for the electronic device 200.

The first housing 210 and the second housing 220 may form an exterior of the electronic device 200. In an example embodiment, the first housing 210 and the second housing 220 may be connected to the hinge 280 to form the rear surface of the electronic device 200. The first housing 220 and the second housing 230 may each include a side surface that partially covers the front surface, the rear surface, and a space between the front surface and the rear surface of the electronic device 200. In this case, the front surface of the electronic device 200 may be formed such that most areas thereof are open for visually exposing the display 230 to the outside. Hereinafter, for ease of description, a surface on which the display 230 is exposed or visible to the outside may be referred to as the front surface of the electronic device 200, an opposite surface of the front surface of the electronic device 200 may be referred to as the rear surface of the electronic device 200, and a surface enclosing a space between the front surface and the rear surface may be referred to as the side surface of the electronic device 200.

In an example embodiment, the first housing 210 and the second housing 220 may be connected to the rear surface of the display 230 and may support the first area 231a and the second area 231b of the display 230, respectively. For example, the first housing 210 may be connected to support a rear surface of the first area 231a and may form a first space 211 placed on the rear surface of the first area 231a, and the second housing 220 may be connected to support a rear surface of the second area 231b and may form a second space 221 placed on the rear surface of the second area 231b. In an example embodiment, the first space 211 and the second space 221 may form one space, in which the display 230 is seated, by the coupling of the first housing 210 to the second housing 220.

The hinge 280 may foldably connect the first housing 210 to the second housing 220. In an example embodiment, the first housing 210 and the second housing 220 may be rotatably connected to the hinge 280. In this case, an angle between the first housing 210 and the second housing 220 may be adjusted depending on a using operation of the electronic device 200. In an example embodiment, since the display 230 is supported by the first housing 210 and the second housing 220, an angle between the first area 231a and the second area 231b of the display 230 may change in response to folding and unfolding operations of the first housing 210 and the second housing 220. In the present disclosure, the folding operation may represent an operation of switching the electronic device in a folded state (e.g., a second state, or a folded state of FIG. 2B) to be in an unfolded state (e.g., a first state, or an unfolded state of FIG. 2A). In addition, the unfolding operation may represent an operation of switching an electronic device in an unfolded state (e.g., the first state, or the unfolded state of FIG. 2A) to be in a folded state (e.g., the second state, or the folded state of FIG. 2B).

In an example embodiment, in the first state (e.g., the unfolded state of FIG. 2A) of the electronic device 200, the first housing 210 and the second housing 220 may form an angle of substantially 180 degrees through the hinge 280. In this case, the first area 231a and the second area 231b of the display 230 may be disposed to face the same direction (e.g., the z-axis), thereby forming substantially the same plane. On the other hand, in the second state (e.g., the folded state of FIG. 2B) of the electronic device 200, the first housing 210 and the second housing 220 may be disposed to substantially face each other through the hinge 280. In this case, the first area 231a and the second area 231b of the display 230 may not be visually exposed to the outside by forming a narrow angle (e.g., a range between 0 degrees to approximately 10 degrees) to face each other. In the second state, the folding area 231c of the display 230 may form a curved surface having a predetermined curvature. In an example embodiment, when the electronic device 200 is in the intermediate state, the first housing 210 and the second housing 220 may be disposed to form a predetermined angle between each other through the hinge 280. In this case, the first area 231a and the second area 231b of the display 230 may form an angle smaller than that in the first state and greater than that in the second state. In the intermediate state, the folding area 231c may form a curved surface having a smaller curvature, compared to the second state.

Figure 3A:
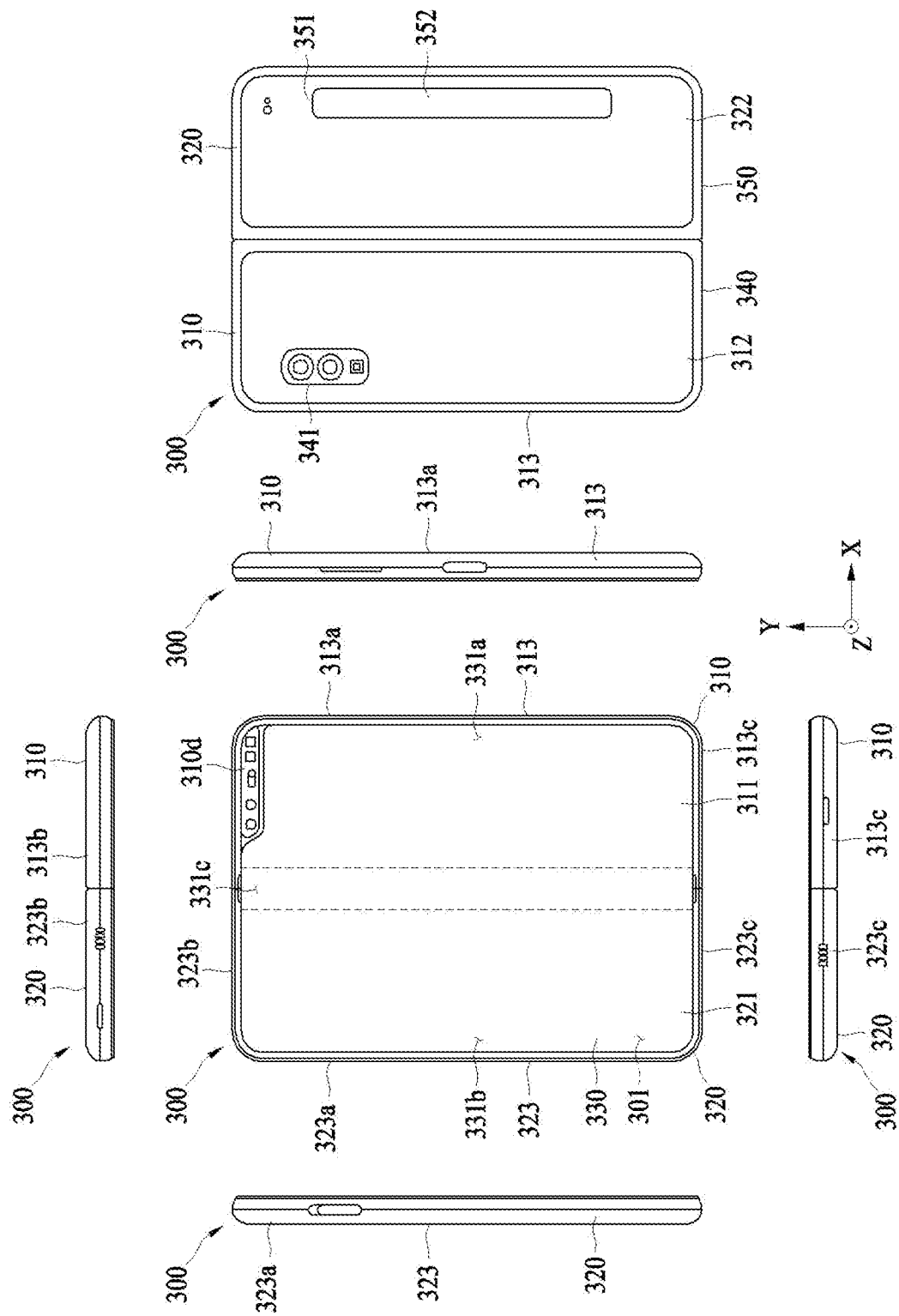
FIG. 3A is a diagram illustrating a foldable electronic device in an unfolded state according to various embodiments.
Figure 3B:
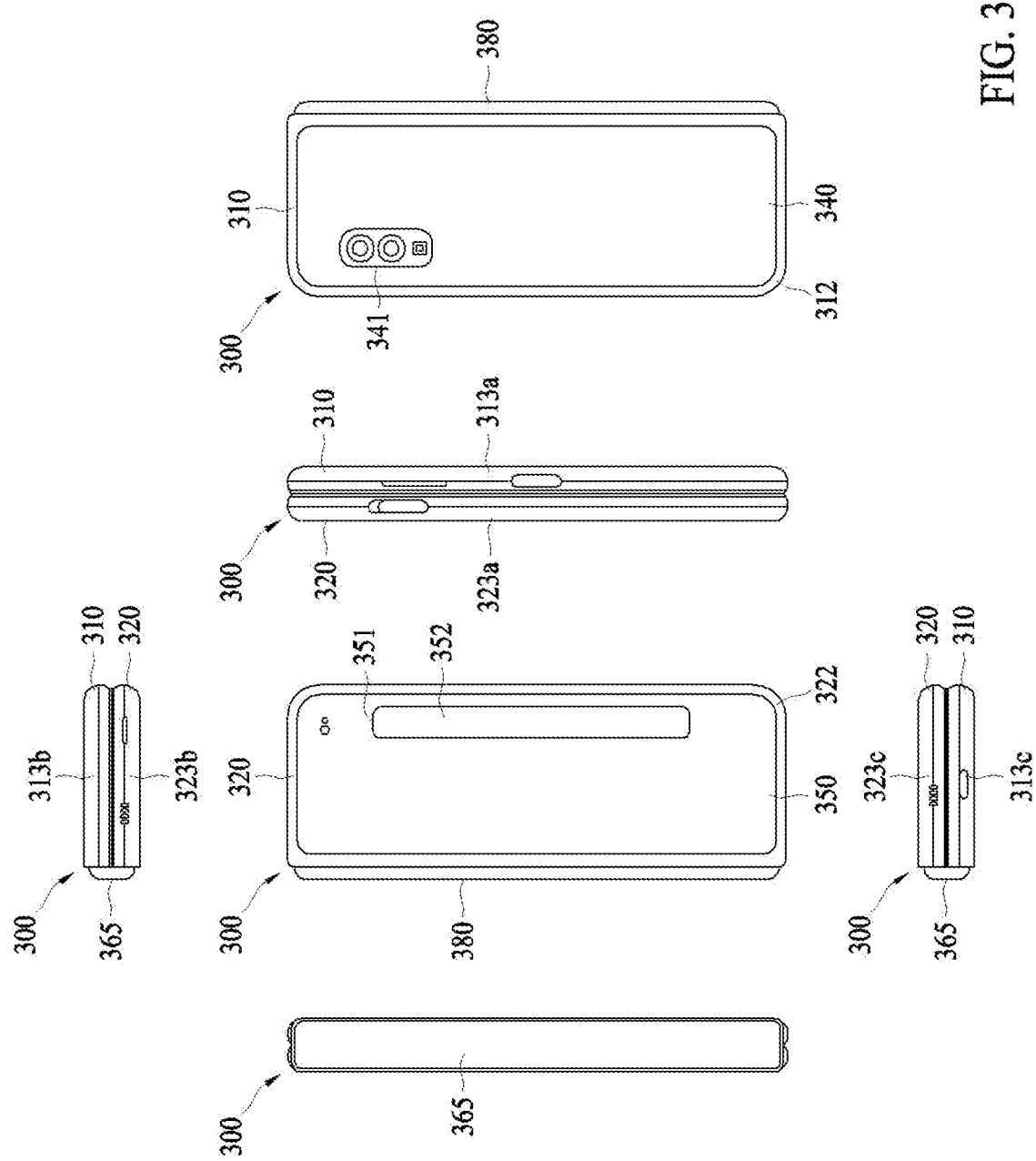
FIG. 3B is a diagram illustrating the foldable electronic device in a folded state according to various embodiments.
Figure 3C:
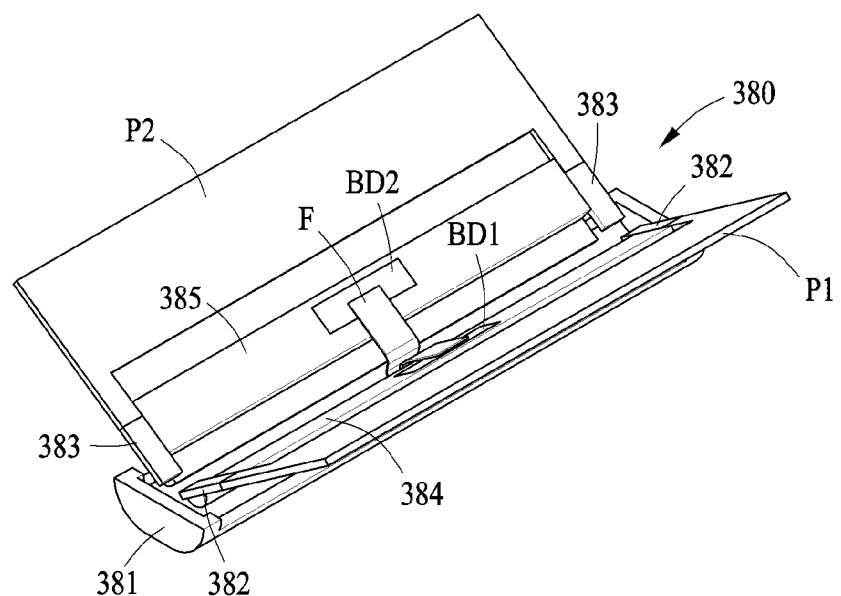
FIGS. 3C and 3D are perspective views of a hinge of the foldable electronic device according to various embodiments.
Figure 3D:
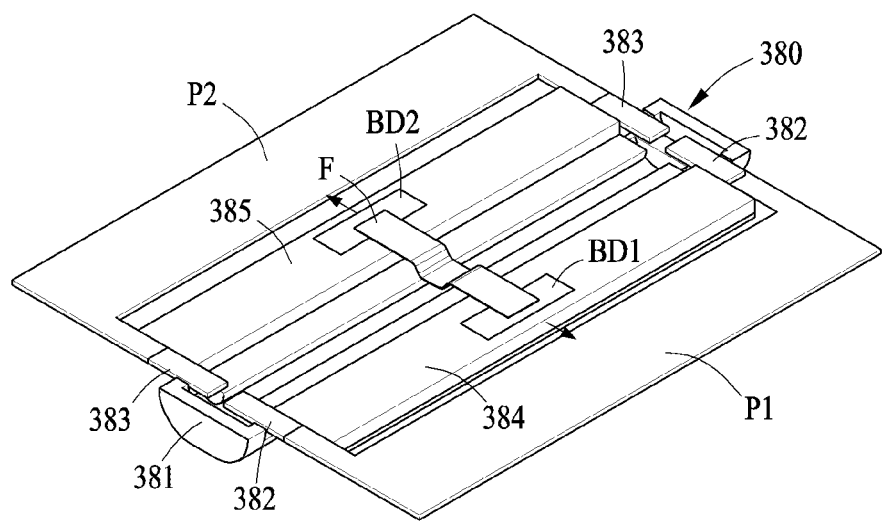

FIG. 3A is a diagram illustrating an example foldable electronic device 300 in an unfolded state according to various embodiments, FIG. 3B is a diagram illustrating the foldable electronic device 300 in a folded state according to various embodiments, and FIGS. 3C and 3D are perspective views of a hinge of the foldable electronic device 300 according to various embodiments.

Referring to FIGS. 3A, 3B, 3C and 3D (which may be referred to as FIGS. 3A to 3D), the electronic device 300 (e.g., the electronic device 101 of FIG. 1 and the electronic device 200 of FIG. 2A) may include a pair of housings, for example, first and second housings 310 and 320, a hinge 380 that rotatably supports the pair of housings 310 and 320, a display 330 (e.g., a flexible display or a foldable display) disposed on a space provided in the pair of housings 310 and 320, a first rear cover 340, and a second rear cover 350.

In an example embodiment, the first housing 310 and the second housing 320 may be substantially symmetrically disposed. In an example embodiment, an angle or a distance between the first housing 310 and the second housing 320 may vary depending on whether the electronic device 300 is in the unfolded state, the folded state, or the intermediate state. In an example embodiment, unlike the second housing 320, the first housing 310 may include a sensor area 310d in which various sensor modules (e.g., the sensor module 176 of FIG. 1) are disposed, and the first housing 310 and the second housing 320 may have shapes symmetrical to each other in areas other than the sensor area 310d. In another example embodiment, the sensor area 310d may be replaced with at least a partial area of the second housing 320. The sensor area 310d may include, for example, a camera hole area, a sensor hole area, an under-display camera (UDC) area, and/or an under-display sensor (UDS) area.

In an example embodiment, the first housing 310 may include a first surface 311 facing the front surface of the electronic device 300, a second surface 312 facing a direction opposite to the first surface 311, and a first side portion 313 enclosing at least a portion of a space between the first surface 311 and the second surface 312. The first side portion 313 may include a first side surface 313a, a second side surface 313b extending from one end portion of the first side surface 313a, and a third side surface 313c extending from the other end portion of the first side surface 313a in a direction substantially parallel with the second surface 313b.

In an example embodiment, the second housing 320 may include a third surface 321 facing the front surface of the electronic device 300, a fourth surface 322 facing a direction opposite to the third surface 321, and a second side portion 323 enclosing at least a portion of a space between the third surface 321 and the fourth surface 322. The second side portion 323 may include a fourth side surface 323a, a fifth side surface 323b extending from one end portion of the fourth side surface 323a, and a sixth side surface 323c extending from the other end portion of the fourth side surface 323a in a direction substantially parallel with the fifth side surface 323b. The first surface 311 and the third surface 321 may face each other when the electronic device 300 is in the folded state.

In an example embodiment, the electronic device 300 may include a recessed accommodating portion, that is, an accommodating portion 301, for accommodating the display 330 through the structural coupling of the first housing 310 and the second housing 320. The accommodating portion 301 may have substantially the same size as the display 330. For example, the accommodating portion 301 may include a first space (e.g., the first space 211 of FIG. 2A) provided in the first housing 310 and a second space (e.g., the second space 221 of FIG. 2A) provided in the second housing 320.

In an example embodiment, at least a portion of the first housing 310 and the second housing 320 may be formed of a metal material or a non-metal material having an appropriate magnitude of rigidity to support the display 330.

In an example embodiment, the sensor area 310d may be formed adjacent to one corner of the first housing 310. However, the arrangement, the shape, or the size of the sensor area 310d are not limited to the illustrated example. In another example embodiment, the sensor area 310d may be formed at another corner of the first housing 310 or in a predetermined area of an upper corner and a lower corner. In an example embodiment, the sensor area 310d may be formed in a shape extending between the first housing 310 and the second housing 320.

In an example embodiment, the electronic device 300 may include at least one component disposed to be exposed on the front surface of the electronic device 300 through the sensor area 310d or at least one opening formed in the sensor area 310d. For example, the component may include at least one of a front camera module, a receiver, a proximity sensor, an illuminance sensor, an iris recognition sensor, an ultrasonic sensor, or an indicator.

In an example embodiment, the first rear cover 340 may be disposed on the second surface 312 of the first housing 310, and may have a substantially rectangular periphery. At least a portion of the periphery of the first rear cover 340 may be surrounded by the first housing 310. The second rear cover 350 may be disposed on the fourth surface 322 of the second housing 320 and may have a substantially rectangular periphery. At least a portion of the periphery of the second rear cover 350 may be surrounded by the second housing 320.

In another example embodiment, the first rear cover 340 and the second rear cover 350 may have substantially symmetrical shapes. In another example embodiment, the first rear cover 340 and the second rear cover 350 may have different shapes. In another example embodiment, the first housing 310 and the first rear cover 340 may be integrally formed, and the second housing 320 and the second rear cover 350 may be integrally formed.

In an example embodiment, the first housing 310, the second housing 320, the first rear cover 340, and the second rear cover 350 may provide a space in which various components (e.g., a PCB, the antenna module 197 of FIG. 1, the sensor module 176 of FIG. 1, or the battery 189 of FIG. 1) of the electronic device 300 may be arranged through a structure in which the first housing 310, the second housing 320, the first rear cover 340, and the second rear cover 350 are coupled to one another. In an example embodiment, at least one component may be visually exposed on the rear surface of the electronic device 300. For example, at least one component may be visually exposed through a first rear area 341 of the first rear cover 340. Here, the component may include a proximity sensor, a rear camera module, and/or a flash. In an example embodiment, at least a portion of a sub-display 352 may be visually exposed through a second rear area 351 of the second rear cover 350. In an example embodiment, the electronic device 300 may include a sound output module (e.g., the sound output module 155 of FIG. 1) disposed through at least a partial area of the second rear cover 350.

In an example embodiment, the display 330 may be disposed in the accommodating portion 301 formed by the pair of housings 310 and 320. For example, the display 330 may be arranged to occupy substantially most of the front surface of the electronic device 300. The to front surface of the electronic device 300 may include an area in which the display 330 is disposed, and a partial area (e.g., a periphery area) of the first housing 310 and a partial area (e.g., a periphery area) of the second housing 320, which are adjacent to the display 330. The rear surface of the electronic device 300 may include the first rear cover 340, a partial area (e.g., a periphery area) of the first housing 310 adjacent to the first rear cover 340, the second rear cover 350, and a partial area (e.g., a periphery area) of the second housing 320 adjacent to the second rear cover 350. In an example embodiment, based on movement of the first housing 310 and the second housing 320, at least a partial area of the display 330 may be deformed to a flat surface or a curved surface. In an example embodiment, the display 330 may include a folding area 331c, a first area 331a on a first side (e.g., the right side) of the folding area 331c, and a second area 331b on a second side (e.g., the left side) of the folding area 331c. For example, the first area 331a may be positioned on the first surface 311 of the first housing 310, and the second area 331b may be positioned on the third surface 321 of the second housing 320. However, the area division of the display 330 is merely an example, and the display 330 may be divided into a plurality of areas depending on the structure or functions of the display 330. The area division of the display 330 is merely a physical division based on the pair of housings 310 and 320 and the hinge 380, and the display 330 may display substantially one screen through the pair of housings 310 and 320 and the hinge 380. In an example embodiment, the first area 331a may include a notch area formed along the sensor area 310d, but the other areas of the first area 331a may be substantially symmetrical to the second area 331b. In an embodiment, since the sensor area 310d is not exposed to the first area 331a or the second area 331b, the first area 331a and the second area 331b may have substantially symmetrical shapes.

In an example embodiment, the hinge 380 may include a hinge cover 365. The hinge cover 365 may be disposed between the first housing 310 and the second housing 320 and may form an exterior of the hinge 380. The hinge cover 365 may prevent and/or reduce components of the hinge 380 from being exposed to the outside by covering the components of the hinge 380. The hinge cover 365 may be hidden by at least a portion of the first housing 310 and the second housing 320 or exposed to the outside according to the operating state of the electronic device 300. For example, when the electronic device 300 is in an unfolded state, as shown in FIG. 3A, the hinge cover 365 may be hidden by the first housing 310 and the second housing 320 and not exposed to the outside, and when the electronic device 300 is in a folded state, as shown in FIG. 3B, the hinge cover 365 may be exposed to the outside between the first housing 310 and the second housing 320. When the electronic device 300 is in an intermediate state in which an angle between the unfolded state, as shown in FIG. 3A and the folded state, as shown in FIG. 3B, is formed, at least a portion of the hinge cover 365 may be exposed to the outside between the first housing 310 and the second housing 320, and in this case, the area, of the hinge cover 365, exposed to the outside may be less than the area of the hinge cover 365 exposed when the electronic device 300 is in the folded state. In an example embodiment, the hinge cover 365 may include a curved shape.

In an example embodiment, when the electronic device 300 is in an unfolded state (e.g., the unfolded state of FIG. 3A), the first housing 310 and the second housing 320 may form a first angle (e.g., about 180 degrees) with each other, and the first area 331a and the second area 331b of the display 330 may be oriented in substantially the same direction. The folding area 331c of the display 330 may be on substantially the same plane as the first area 331a and the second area 331b. In another example embodiment, when the electronic device 300 is in the unfolded state, the first housing 310 may rotate at a second angle (e.g., about 360 degrees) relative to the second housing 320, whereby the first housing 310 and the second housing 320 may be reversely folded such that the second surface 312 and the fourth surface 322 may face each other. When the electronic device 300 is in the folded state (e.g., the folded sate of FIG. 3B), the first housing 310 and the second housing 320 may face each other. The first housing 310 and the second housing 320 may form an angle of about 0 degrees to about 10 degrees, and the first area 331a and the second area 331b of the display 330 may face each other. In this case, at least a portion of the folding area 331c of the display 330 may be deformed into a curved surface. When the electronic device 300 is in the intermediate state, the first housing 310 and the second housing 320 may form a predetermined angle with each other. In this case, an angle (e.g., a third angle, about 90 degrees) formed by the first area 331a and the second area 331b of the display 330 may be greater than that when the electronic device 300 is in the folded state and less than that when the electronic device 300 is in the unfolded state. In this case, the folding area 331c may be deformed such that a curvature of the folding area 331c is less than that of the curved surface of the electronic device 300 in the folded state.

In an example embodiment, a display may include a flexible display substrate, a plurality of display elements coupled to the display substrate to form multiple pixels, one or more conductive lines coupled to the display substrate and electrically connected to other display elements, and a thin-film encapsulation layer configured to prevent and/or reduce an inflow of external oxygen and moisture. In an example embodiment, the display may include a touch panel or may be integrally formed therewith.

The display substrate may be formed of a flexible material, for example, a plastic material, such as polyimide (PI), but the material of the display substrate is not limited thereto and may include various materials having flexible properties. The plurality of display elements may be arranged on the display substrate and form some pixels. For example, the plurality of display elements may be arranged in a matrix form on the display substrate to form pixels of the display. In this case, the plurality of display elements may include a fluorescent material or an organic fluorescent material capable of expressing colors. For example, the elements of the display may include organic light-emitting diodes (OLEDs). The conductive lines may include one or more gate signal lines or one or more data signal lines. For example, the conductive lines may include a plurality of gate signal lines and a plurality of data signal lines, and the plurality of gate signal lines and the plurality of data signal lines may be arranged in a matrix form. In this case, the plurality of display elements may be arranged adjacent to a point where a plurality of lines intersect with one another and may be electrically connected to each line. The thin film encapsulation layer may cover the display substrate, the plurality of display elements, and the conductive lines, thereby preventing and/or reducing an inflow of external oxygen and moisture. In an example embodiment, the thin film encapsulation layer may be formed by alternately stacking one or more organic film layers and one or more inorganic film layers.

In an example embodiment, a touch panel may be formed as an integral body on the display or attached thereto. For example, the touch panel may be formed by patterning an aluminum metal mesh sensor on the thin film encapsulation layer of the display.

In an example embodiment, the polarizing film may be stacked between the display and the touch panel. The polarizing film may improve visibility of the display. The polarizing film may change a phase of light passing through the display. For example, the polarizing film may convert linearly polarized light into circularly polarized light or convert circularly polarized light into linearly polarized light, thereby preventing and/or reducing reflection of light incident to the display.

The window layer may be formed of a transparent plastic film having high flexibility and high hardness. For example, the window layer may be disposed at a position where at least one surface thereof is exposed to the outside. For example, the window layer may be formed of a PI or polyethylene terephthalate (PET) film. In an example embodiment, the window layer may be formed as multiple layers including a plurality of plastic films.

In an example embodiment, the hinge 380 may include a hinge body 381, a first support plate 382 and a second support plate 383 both rotatably connected to the hinge body 381, a first slider 384 slidably connected to the first support plate 382, a second slider 385 slidably connected to the second support plate 383, a flexible PCB (FPCB) F of which one side is connected to the first slider 384 and the other side is connected to the second slider 385, circuit boards BD1 and BD2 connected to the FPCB F, a first display support P1 connected to the first support plate 382 and configured to support the first housing 310, and a second display support P2 connected to the first support plate 383 and configured to support the second housing 320.

In an example embodiment, the first support plate 382 may be connected to the first housing 310 and may integrally move with the first housing 310. For example, at least a portion of the first support plate 382 may be fixed to the first housing 310. The second support plate 383 may be connected to the second housing 320 and may integrally move with the second housing 320. For example, at least a portion of the second support plate 383 may be fixed to the second housing 320.

In an example embodiment, the first support plate 382 and the first display support P1 may be positioned in a rear direction of the first area 331a of the display 330 and may be coupled to the first housing 310. For example, the first support plate 382 and the first display support P1 may integrally move with the first housing 310. For example, while the first housing 310 performs unfolding or folding operations, the first support plate 382 and the first display support P1 may perform the unfolding or folding operations together with the first housing 310.

In an example embodiment, the second support plate 383 and the second display support P2 may be positioned in a rear direction of the second area 331b of the display 330 and may be coupled to the second housing 320. For example, the second support plate 383 and the second display support P2 may integrally move with the second housing 320. For example, while the second housing 320 performs unfolding or folding operations, the second support plate 383 and the second display support P2 may perform unfolding or folding operations together with the second housing 320. In an example embodiment, a portion of the FPCB F may be connected to the first circuit board BD1 disposed on the first slider 384, and the other portion of the FPCB F may be connected to the second circuit board BD2 disposed on the second slider 385.

In an example embodiment, during the unfolding operation, the first slider 384 and the second slider 385 may slide in an arrow direction with respect to the first support plate 382 and the second support plate 383, respectively. During the unfolding operation, the first slider 384 may slide in a direction in which a distance between the first slider 384 and the first display support P1 decreases. The second slider 385 may slide in a direction in which a distance between the second slider 385 and the second display support P2 decreases. As the first slider 384 and the second slider 385 move further to both sides, a degree of a curvature of the FPCB F may decrease, and a crack occurring may decrease.

Figure 4A:
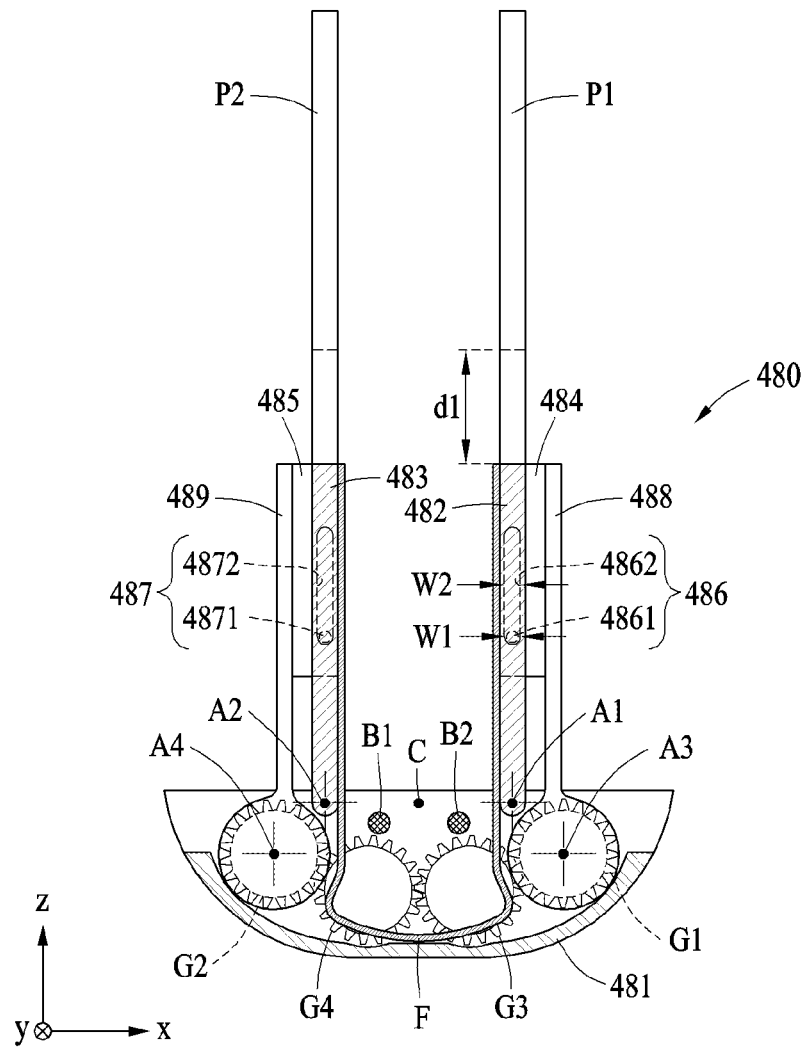
FIG. 4A is a cross-sectional view of a hinge of an electronic device in a folded state according to various embodiments.
Figure 4B:
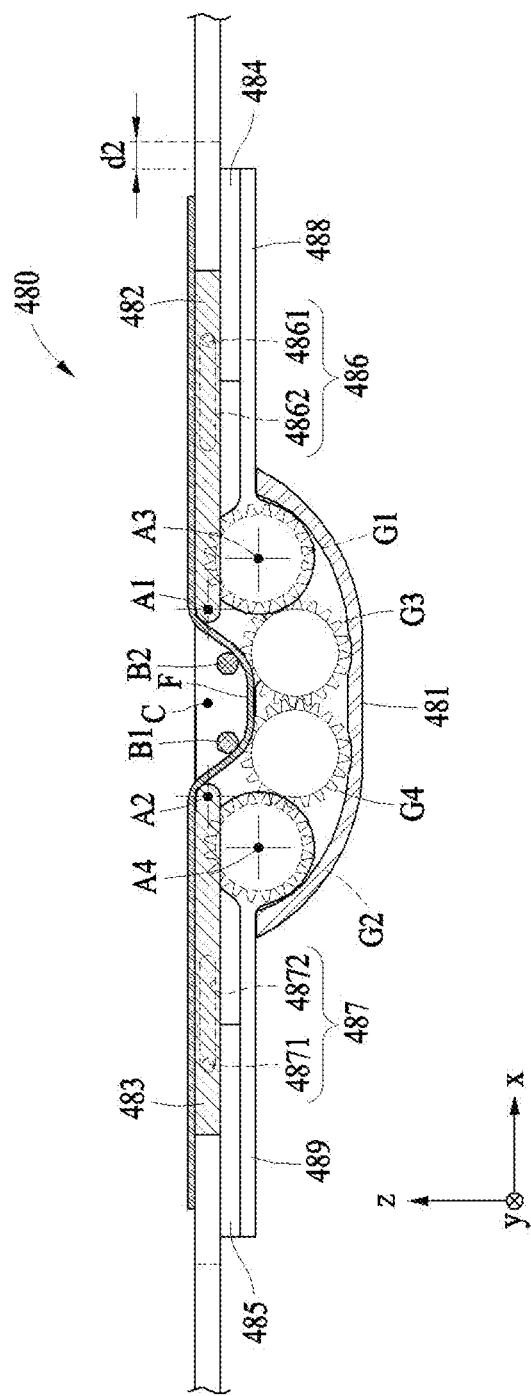
FIG. 4B is a cross-sectional view of the hinge of the electronic device in an unfolded state according to various embodiments.
Figure 4C:
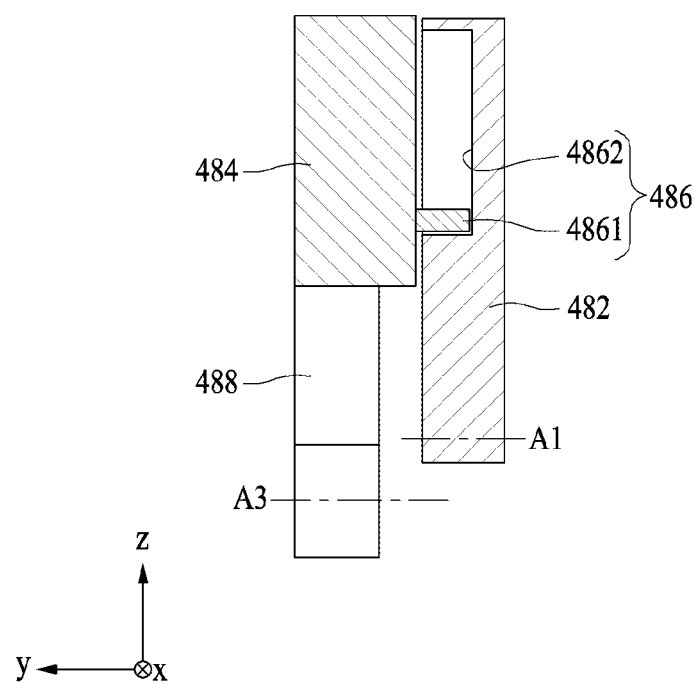
FIG. 4C is a cross-sectional view of a first support plate, a first slider, a first connecting part, and a first guide plate, according to various embodiments.

FIG. 4A is a cross-sectional view illustrating an example hinge of an electronic device in a folded state according to various embodiments. FIG. 4B is a cross-sectional view of the hinge of the electronic device in an unfolded state according to various embodiments. FIG. 4C is a cross-sectional view of a first support plate, a first slider, a first connecting part, and a first guide plate, according to various embodiments.

Referring to FIGS. 4A, 4B and 4C (which may be referred to as FIGS. 4A to 4C), an electronic device (e.g., the electronic device 101 of FIG. 1, the electronic device 200 of FIG. 2A, and the electronic device 300 of FIG. 3A) in which an FPCB moves with respect to a support plate during an unfolding operation (hereinafter, referred to as the electronic device) may include a hinge 480 that supports an FPCB F.

In an example embodiment, the hinge 480 may include a hinge body 481 that may relatively move with respect to a first housing (e.g., the first housing 310 of FIG. 3A) and/or a second housing (e.g., the second housing 320 of FIG. 3A), a first support plate 482 and a second support plate 483 both rotatably connected to the hinge body 481, a first slider 484 slidable along the first support plate 482, a second slider 485 slidable along the second support plate 483, a first connecting part 486 connecting the first support plate 482 to the first slider 484, a second connecting part 487 connecting the second support plate 483 to the second slider 485, a first guide plate 488 rotatably connected to the hinge body 481 and configured to support the first slider 484, a second guide plate 489 rotatably connected to the hinge body 481 and configured to support the second slider 485, a plurality of gears G1, G2, G3 and G4 (which may be referred to as gears G1 to G4), at least one of base loads B1 and B2, a first display support P1 connected to the first support plate 482, and a second display support P2 connected to the second support plate 483.

In an example embodiment, at least a portion of the hinge body 481 may be covered by the first housing (e.g., the first housing 310 of FIG. 3A) and/or the second housing (e.g., the second housing 320 of FIG. 3A). The hinge body 481 may have a pillar shape having a hollow inside. For example, the hinge body 481 may have a pillar shape vertically formed in the y-axis direction, which is a longitudinal direction of the hinge body 481. Some components of the hinge 480 may be rotatably connected to one side surface of the hinge body 481. For example, some components of the hinge 480 may be rotatably connected to an inner side surface, of which a normal line faces the y-axis direction, of the hinge body 481. The components may be rotatably connected to the hinge body 481 based on a rotation axis parallel with the longitudinal direction of the hinge 480, that is, the rotation axis parallel with the y-axis.

In an example embodiment, the first support plate 482 and the second support plate 483 may be rotatably connected to the hinge body 481, respectively. The first support plate 482 may be connected to the first housing (e.g., the first housing 310 of FIG. 3A) and may integrally move with the first housing. The second support plate 483 may be connected to the second housing (e.g., the second housing 320 of FIG. 3A) and may integrally move with the second housing.

In an example embodiment, the first support plate 482 may be rotatably connected to the hinge body 481 based on a first rotation axis A1. The first rotation axis A1 may be an axis substantially parallel with the y-axis.

In an example embodiment, the second support plate 483 may be rotatably connected to the hinge body 481 based on a second rotation axis A2. The second rotation axis A2 may be an axis parallel with the y-axis. A center line C may be provided at a point between the first rotation axis A1 and the second rotation axis A2 having the same distance from the first rotation axis A1 and the second rotation axis A2. The hinge 480 may have a symmetrical shape with respect to the center line C.

In an example embodiment, the first slider 484 may slide along the first support plate 482, and may support one side of the FPCB F (e.g., the FPCB F of FIG. 3C or 3D). For example, when the electronic device is in the unfolded state, the first slider 484 may support a right end portion, that is, an end portion in the +x direction, of the FPCB F. For example, one side of the FPCB F may be fixed to the first slider 484 by welding and/or bonding. As another example, the first slider 484 may provide a substrate hole (not shown) for passing the FPCB F, and the FPCB F may be fixed to the first slider 484 by passing through the substrate hole. At least a portion of the FPCB F may be connected to a circuit board (e.g., the circuit board BD1 of FIG. 3D).

In an example embodiment, the second slider 485 may slide along the second support plate 483 and may support the other side of the FPCB F (e.g., the FPCB F of FIG. 3C or 3D). For example, when the electronic device is in the folded state, the second slider 485 may support a left end portion, that is, an end portion in the −x direction, of the FPCB F. For example, the other side of the FPCB F may be fixed to the second slider 485 by welding and/or bonding. As another example, the second slider 485 may provide a substrate hole (not shown) for passing the FPCB F, and the FPCB F may be fixed to the second slider 485 by passing through the substrate hole. At least a portion of the FPCB F may be connected to the circuit board (e.g., the circuit board B2 of FIG. 3D).

In an example embodiment, the first connecting part 486 may connect the first support plate 482 to the first slider 484. The first connecting part 486 may assist the first support plate 482 and the first slider 484 to restrain movement from each other. For example, the first support plate 482 and the first slider 484 may move in one degree of freedom. For example, when the first support plate 482 rotates with respect to the hinge body 481, the first slider 484 may slide along the first support plate 482. For example, when the first support plate 482 rotates (e.g., an unfolding operation) clockwise based on the first rotation axis A1, the first slider 484 may move along the first support plate 482 in a direction (e.g., the +x-axis direction) distancing from the first rotation axis A1. For example, when the first support plate 482 rotates (e.g., a folding operation) counterclockwise based on the first rotation axis A1, the first slider 484 may move along the first support plate 482 in a direction (e.g., the −x-axis direction) approaching the first rotation axis A1. The rotation operation of the first support plate 482 may correspond one-to-one to the sliding operation of the first slider 484.

In an example embodiment, the first connecting part 486 may include a connecting body 4861 connected to any one of the first support plate 482 and the first slider 484, and a connecting guide 4862 provided at any one of the first support plate 482 and the first slider 484, and configured to accommodate the connecting body 4861. The example in the drawings illustrates that the connecting body 4861 is connected to the first slider 484, and the first connecting guide 4862 is provided at the first support plate 482, however, the example is not limited thereto. For example, the connecting body 4861 may be connected to the first support plate 482, and the connecting guide 4862 may be provided at the first slider 484. Hereinafter, the description is provided based on that the connecting body 4861 is connected to the first slider 484, and the connecting guide 4862 is provided at the first support plate 482.

In an example embodiment, the connecting body 4861 may protrude from the first slider 484 toward the y-axis direction. The connecting guide 4862 may have a shape recessed from a surface of the first support plate 482 toward the y-axis direction. The connecting body 4861 may slide along the connecting guide 4862. For example, a height (or a depth) that the connecting body 4861 protrudes toward the y-axis direction may be substantially the same as a depth (or a height) that the connecting guide 4862 is recessed toward the y-axis direction. In an example embodiment, a width W1 of the connecting body 4861 may be approximately equal to a width W2 of the connecting guide 4862. The connecting body 4861 may slide with at least a portion of the connecting body 4861 contacting with an inner surface of the connecting guide 4862. In an example embodiment, while the connecting body 4861 moves along the connecting guide 4862, a distance between the connecting body 4861 and the first rotation axis A1 may change. While the first support plate 482 rotates in a direction in which an angle between the first support plate 482 and the second support plate 483 increases, the connecting body 4861 may move along the connecting guide 4862 in a direction distancing from the first rotation axis A1. In other words, while the electronic device is switching from the folded state to the unfolded state (that is, during the unfolding operation), the connecting body 4861 may move along the connecting guide 4862 in a direction distancing from the first rotation axis A1. For example, while the first support plate 482 rotates clockwise based on the first rotation axis A1, the connecting body 4861 may move along the connecting guide 4862 in a direction distancing from the first rotation axis A1.

In an example embodiment of the present disclosure, an angle between the first support plate 482 and the second support plate 483 may be an angle formed by a surface of the first support plate 482 and a surface of the second support plate 483 that face each other, when the electronic device is in the folded state. For example, when the electronic device is in a folded state (refer to FIG. 4A), an angle between the first support plate 482 and the second support plate 483 may be 0 degrees. For example, when the electronic device is in an unfolded state (refer to FIG. 4B), an angle between the first support plate 482 and the second support plate 483 may be about 180 degrees.

In an example embodiment, the second connecting part 487 may connect the second support plate 483 to the second slider 485. The second connecting part 487 may assist the second support plate 483 and the second slider 485 to restrain movements from each other. For example, the second support plate 483 and the second slider 485 may move in one degree of freedom. For example, when the second support plate 483 rotates with respect to the hinge body 481, the second slider 485 may slide along the second support plate 483. The rotation operation of the second support plate 483 may correspond one-to-one to the sliding operation of the second slider 485. The second connecting part 487 may include a connecting body 4871 and a connecting guide 4872. An operation of the second connecting part 487 may be similar to the operation of the first connecting part 486. For example, the operation of the second connecting part 487 may be the same as or similar to the operation of the first connecting part 486, however may be implemented in the opposite direction.

In an example embodiment, the first guide plate 488 may be rotatably connected to the hinge body 481 based on a third rotation axis A3 and may support the first slider 484. The third rotation axis A3 may be parallel with the first rotation axis A1 and may be spaced apart from the first rotation axis A1. For example, the third rotation axis A3 may be provided at a location apart from the first rotation axis A1 in the +x direction and in the −z direction, based on the center line C. For example, a distance between the third rotation axis A3 and the second rotation axis A2 may be greater than a distance between the third rotation axis A3 and the first rotation axis A1. For example, a distance between the third rotation axis A3 and the center line C may be greater than a distance between the first rotation axis A1 and the center line C. A distance from an upper surface of the hinge body 481 to the third rotation axis A3 may be greater than a distance from the upper surface of the hinge body 481 to the first rotation axis A1.

In an example embodiment, the second guide plate 489 may be rotatably connected to the hinge body 481 based on a fourth rotation axis A4 and may support the second slider 485. The fourth rotation axis A4 may be parallel with the second rotation axis A2 and may be spaced apart from the second rotation axis A2. For example, the fourth rotation axis A4 may be provided at a location apart from the second rotation axis A2 in the −x direction and the −z direction. For example, a distance between the fourth rotation axis A4 and the first rotation axis A1 may be greater than a distance between the fourth rotation axis A4 and the second rotation axis A2. For example, a distance between the fourth rotation axis A4 and the center line C may be greater than a distance between the second rotation axis A2 and the center line C. A distance from the upper surface of the hinge body 481 to the fourth rotation axis A4 may be greater than a distance from the upper surface of the hinge body 481 to the second rotation axis A2.

In an example embodiment, while the first support plate 482 and the first display support P1 are rotating, a distance between the first slider 484 and the first rotation axis A1 may change. While the first support plate 482 rotates in a direction in which an angle between the first support plate 482 and the second support plate 483 increases, the first slider 484 may move along the first support plate 482 in a direction distancing from the first rotation axis A1. A first distance d1 (e.g., a distance apart in the z-axis direction with reference to FIG. 4A that illustrates the folded state) between the first slider 484 and the first display support P1 may be greater than a second distance d2 (e.g., a distance apart in the x-axis direction with reference to FIG. 4B illustrating the unfolded state) between the first slider 484 and the first display support P1. In other words, during the unfolding operation, the distance from the first slider 484 to the first display support P1 may decrease.

In an example embodiment, while the second support plate 483 and the second display support P2 are rotating, a distance between the second slider 485 and the second rotation axis A2 may change. While the second support plate 483 rotates in a direction in which an angle between the first support plate 482 and the second support plate 483 increases, the second slider 485 may move along the second support plate 483 in a direction distancing from the second rotation axis A2.

In an example embodiment, the at least one of the base loads B1 and B2 may assist in preventing and/or reducing a central portion of the FPCB F from escaping to the outside of the hinge body 481. For example, the at least one of the base loads B1 and B2 may include a first base load B1 and a second base load B2 spaced apart from each other. The central portion of the FPCB F may approach at least one of the base loads B1 and B2 during the unfolding operation of the electronic device. For example, the FPCB F may be spaced apart from the at least one of the base loads B1 and B2 when the electronic device is in the folded state as well as in the unfolded state.

In an example embodiment, the plurality of gears G1 to G4 may include a first driving gear G1 connected to the first guide plate 488 and rotatable based on the third rotation axis A3, a second driving gear G2 connected to the second guide plate 489 and rotatable based on the fourth rotation axis A4, and an even number of connecting gears G3 and G4 configured to connect the first driving gear G1 to the second driving gear G2.

In an example embodiment, the first driving gear G1 may be fixed to the first guide plate 488 and may rotate together with the first guide plate 488. The second driving gear G2 may be fixed to the second guide plate 489 and may rotate together with the second guide plate 489. The even number of the connecting gears G3 and G4 is illustrated as two, however, the example is not limited thereto, and any even number is sufficient.

In an example embodiment, the connecting gears G3 and G4 may assist the first driving gear G1 and the second driving gear G2 to be driven simultaneously in one degree of freedom. When the first driving gear G1 rotates, the second driving gear G2 may rotate by receiving power from the connecting gears G3 and G4, and vice versa. As the connecting gears G3 and G4 are provided in an even number, the first driving gear G1 and the second driving gear G2 may rotate in opposite directions. For example, when the first driving gear G1 rotates clockwise, the first connecting gear G3 may rotate counterclockwise, the second connecting gear G4 may rotate clockwise, and the second driving gear G2 may rotate counterclockwise.

In an example embodiment, by the plurality of gears G1 to G4, the first support plate 482, the second support plate 483, the first slider 484, the second slider 485, the first guide plate 488, and the second guide plate 489 may move in the one degree of freedom.

In an example embodiment, both end portions of the FPCB F supported by the hinge 480 may distance from each other in the x-axis direction during the unfolding operation. In other words, the FPCB F may be unfolded in a direction in which the curvature of the FPCB F decreases during the unfolding operation. When the electronic device is in the unfolded state, the curvature of the FPCB F may decrease and an intensity applied to the FPCB F may decrease by the movement of the first slider 484 and the second slider 485.

Figure 5A:
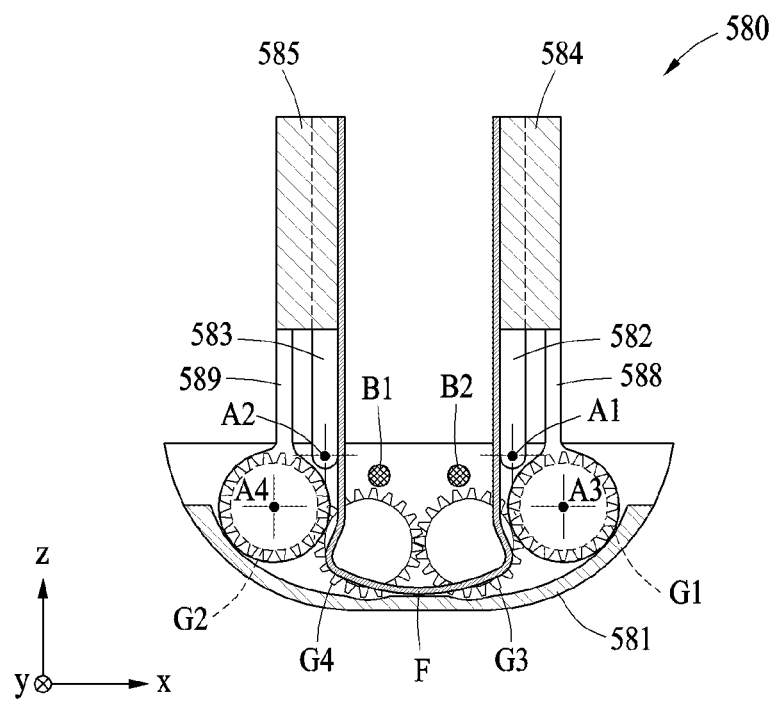
FIG. 5A is a cross-sectional view of a hinge of an electronic device in a folded state according to various embodiments.
Figure 5B:
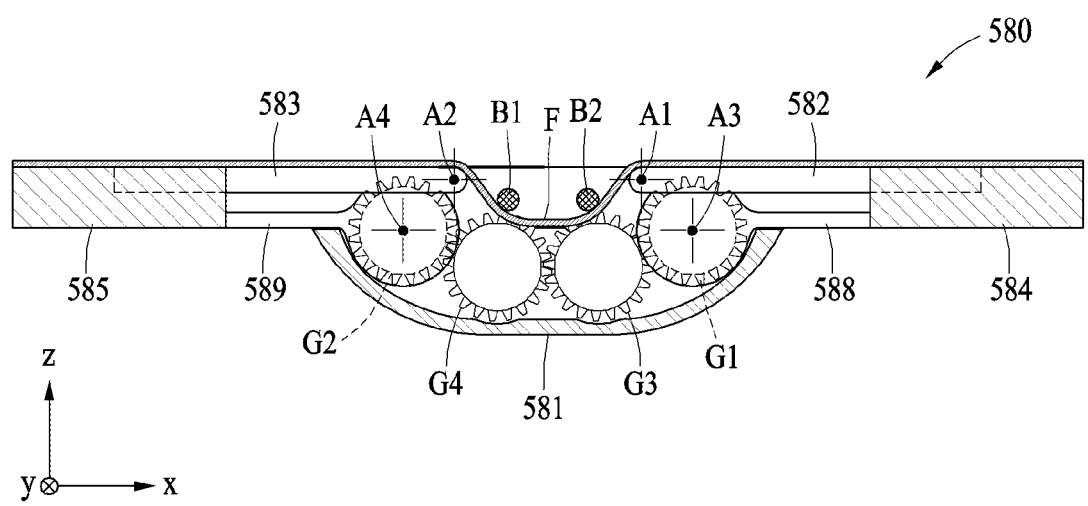
FIG. 5B is a cross-sectional view of the hinge of the electronic device in an unfolded state according to various embodiments.

FIG. 5A is a cross-sectional view illustrating an example hinge of an electronic device in a folded state according to various embodiments. FIG. 5B is a cross-sectional view of the hinge of the electronic device in an unfolded state according to various embodiments.

Referring to FIGS. 5A and 5B, an electronic device (e.g., the electronic device 101 of FIG. 1, the electronic device 200 of FIG. 2A, and the electronic device 300 of FIG. 3A) may include a hinge 580 that supports an FPCB F. In FIGS. 5A and 5B, a duplicated description of components having the same reference numerals as the components described may not be repeated. FIGS. 5A and 5B are cross-sectional views of a first slider (e.g., the first slider 484 of FIGS. 4A and 4B) and a second slider (e.g., the second slider 485 of FIGS. 4A and 4B), compared to FIGS. 4A and 4B. In an example embodiment, a first support plate 582, a second support plate 583, a first slider 584, a second slider 585, a first guide plate 588, and a second guide plate 589 may have a configuration and/or a function that is substantially the same as described with reference to FIGS. 4A and 4B.

In an example embodiment, the hinge 580 may include a hinge body 581 configured to move relative to a first housing (e.g., the first housing 310 of FIG. 3A) and/or a second housing (e.g., the second housing 320 of FIG. 3A), the first support plate 582 rotatably connected to the hinge body 581 based on a first rotation axis A1, the second support plate 583 rotatably connected to the hinge body 581 based on a second rotation axis A2, the first slider 584 slidable along the first support plate 582 and supporting one side of an FPCB F, the second slider 585 slidable along the second support plate 583 and supporting the other side of the FPCB F, the first guide plate 588 rotatably connected to the hinge body 581 and configured to support the first slider 584, the second guide plate 589 rotatably connected to the hinge body 581 and configured to support the second slider 585, and at least one of base loads B1 and B2.

In an example embodiment, during a folding operation, in other words, while the electronic device is switching from a folded state (e.g., FIG. 5A) to an unfolded state (e.g., FIG. 5B), the first slider 584 may slide along the first support plate 582 in a direction distancing from the first rotation axis A1, and the second slider 585 may slide along the second support plate 583 in a direction distancing from the second rotation axis A2. During the unfolding operation, the FPCB F may be unfolded in the x-axis direction, and a central portion of the FPCB F may approach the at least one of base loads B1 and B2.

In an example embodiment, in a folded state of the electronic device, in other words, in a state in which the first support plate 582 and the second support plate 583 are disposed in parallel, the first slider 584 and the second slider 585 may be disposed in parallel. In an unfolded state of the electronic device, in other words, in a state in which the first support plate 582 is aligned with the second support plate 583, the first slider 584 may be aligned with the second slider 585. When the electronic device is in any one of the unfolded state and the folded state, the structural stability of the hinge 580 may be improved since the first support plate 582 and the first slider 584 are provided in parallel and the second support plate 583 and the second slider 585 are provided in parallel.

Figure 6A:
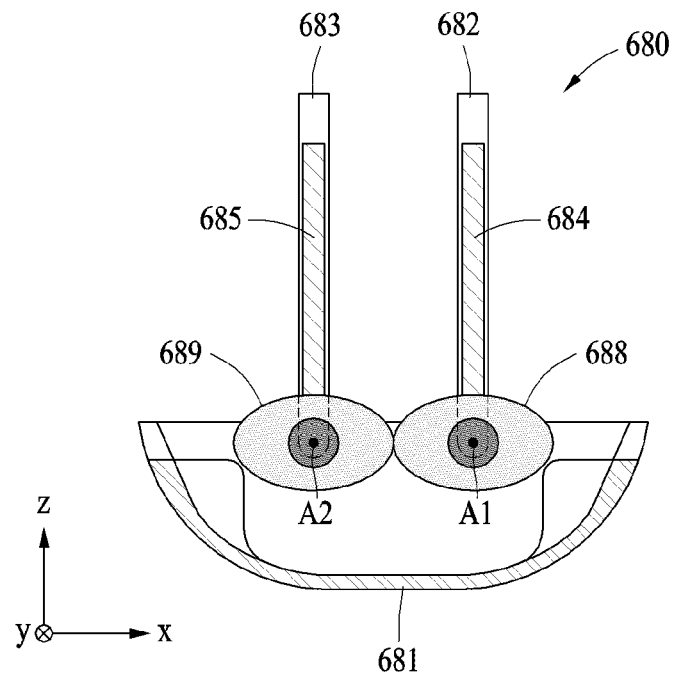
FIG. 6A is a cross-sectional view of a hinge of an electronic device in a folded state according to various embodiments.
Figure 6B:
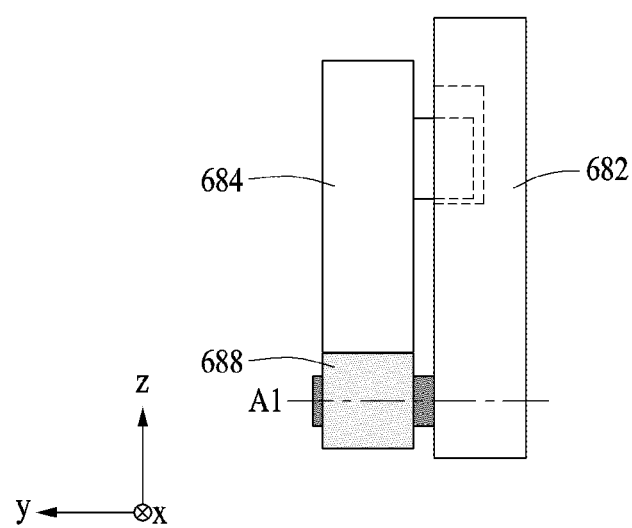
FIG. 6B is a cross-sectional view of a first support plate, a first slider, and a guide cam of the electronic device in a folded state, according to various embodiments.
Figure 6C:
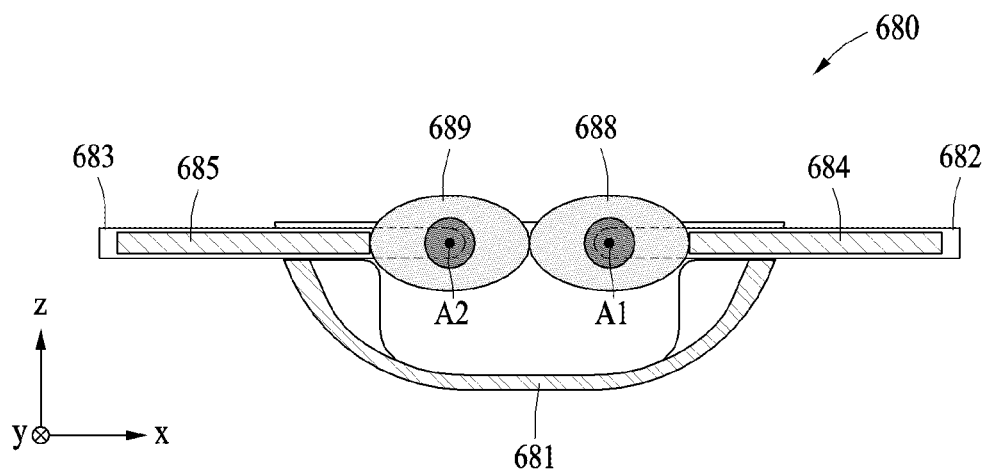
FIG. 6C is a cross-sectional view of the hinge of the electronic device in an unfolded state according to various embodiments.
Figure 6D:
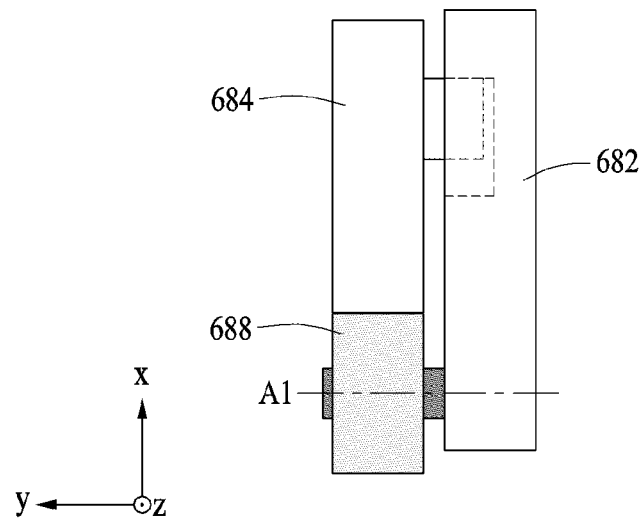
FIG. 6D is a cross-sectional view of a first support plate, a first slider, and a guide cam of the electronic device in an unfolded state according to various embodiments.

FIG. 6A is a cross-sectional view illustrating an example hinge of an electronic device in a folded state according to various embodiments. FIG. 6B is a cross-sectional view of a first support plate, a first slider, and a guide cam of the electronic device in a folded state, according to various embodiments. FIG. 6C is a schematic cross-sectional view of the hinge of the electronic device in an unfolded state according to various embodiments. FIG. 6D is a schematic cross-sectional view of the first support plate, the first slider, and the guide cam of the electronic device in an unfolded state according to various embodiments.

Referring to FIGS. 6A and 6B, the electronic device (e.g., the electronic device 101 of FIG. 1, the electronic device 200 of FIG. 2A, and the electronic device 300 of FIG. 3A) may include a hinge 680. In FIGS. 6A, 6B, 6C and 6D (which may be referred to as FIGS. 6A to 6D), a duplicated description of components having the same reference numerals as the components described above may not be repeated.

In an example embodiment, the hinge 680 may include a hinge body 681 configured to move relative to a first housing (e.g., the first housing 310 of FIG. 3A) and/or a second housing (e.g., the second housing 320 of FIG. 3A), a first support plate 682 rotatably connected to the hinge body 681 based on a first rotation axis A1, a second support plate 683 rotatably connected to the hinge body 681 based on a second rotation axis A2, a first slider 684 slidable along the first support plate 682, a second slider 685 slidable along the second support plate 683, a first guide cam 688 connected to the hinge body 681 and interfering with the first slider 684, and a second guide cam 689 connected to the hinge body 681 and interfering with the second slider 685.

The first slider 684 may be slidably connected to the first support plate 682 in one degree of freedom. The second slider 685 may be slidably connected to the second support plate 683 in one degree of freedom.

The first guide cam 688 may press the first slider 684 while the first support plate 682 is rotating. The first guide cam 688 may assist the first slider 684 to slide with respect to the first support plate 682 by pressing the first slider 684. A length of a portion, of the first guide cam 688, protruding from the first rotation axis A1 toward a first direction, for example, the +z direction, may be less than a length of a portion, of the first guide cam 688, protruding from the first rotation axis A1 toward a second direction intersecting with the first direction, for example, the +x direction. When the first slider 684 is positioned in the first direction, for example, in the +z direction, based on the first rotation axis A1, a distance between the first rotation axis A1 and the first slider 684 may be less than a distance between the first rotation axis A1 and the first slider 684 when the first slider 684 is positioned in the second direction, for example, in the +x direction, based on the first rotation axis A1.

The second guide cam 689 may press the second slider 685 while the second support plate 683 is rotating. The second guide cam 689 may assist the second slider 685 to slide with respect to the second support plate 683 by pressing the second slider 685. Of the second guide cam 689, a length of a portion protruding from the second rotation axis A2 toward the +z direction may be less than a length of a portion protruding from the first rotation axis A1 toward the −x direction. When the second slider 685 is positioned in the +z direction, based on the second rotation axis A2, a distance between the second rotation axis A2 and the second slider 685 may be less than a distance between the second rotation axis A2 and the second slider 685 when the second slider 685 is positioned in the −x direction, based on the second rotation axis A2.

According to various example embodiments, a foldable electronic device configured to move a flexible printed circuit board (FPCB) during an unfolding operation may include: a hinge; a first housing and a second housing both rotatably connected to the hinge; a display deformable based on movements of the first housing and the second housing; and the FPCB provided at an inside of the first housing and the second housing, wherein the hinge may include: a hinge body; a first support plate rotatably connected to the hinge body based on a first rotation axis and connected to the first housing; a second support plate rotatably connected to the hinge body, and connected to the second housing; a first slider slidable along the first support plate and configured to support one side of the FPCB; and a second slider slidable along the second support plate and configured to support the other side of the FPCB.

In various example embodiments, based on the first support plate rotating, a distance between the first slider and the first rotation axis may change.

In various example embodiments, based on the first support plate rotating in a direction in which an angle between the first support plate and the second support plate increases, the first slider may be configured to move along the first support plate in a direction becoming distant from the first rotation axis.

In various example embodiments, the first slider may be rotatably connected to the hinge body based on a third rotation axis parallel with the first rotation axis and spaced apart from the first rotation axis.

In various example embodiments, a distance between the third rotation axis and the first rotation axis may be greater than a distance between the third rotation axis and a second rotation axis.

In various example embodiments, the hinge may further include: a first connecting part configured to connect the first support plate to the first slider; and a second connecting part configured to connect the second support plate and the second slider.

In various example embodiments, the first support plate and the first slider may be configured to move in one degree of freedom, and the second support plate and the second slider may be configured to move in the one degree of freedom.

In various example embodiments, the first connecting part may include a connecting body connected to any one of the first support plate and the first slider, and a connecting guide provided at the other one of the first support plate and the first slider and configured to accommodate the connecting body.

In various example embodiments, based on the first support plate rotating in the direction in which the angle between the first support plate and the second support plate increases, the connecting body may be configured to move along the connecting guide in a direction becoming distant from the first rotation axis.

In various example embodiments, the electronic device may further include: a first guide plate rotatably connected to the hinge body based on the third rotation axis and configured to support the first slider; and a second guide plate rotatably connected to the hinge body based on a fourth rotation axis and configured to support the second slider.

In various example embodiments, the electronic device may further include: a first driving gear connected to the first guide plate and rotatable based on the third rotation axis; a second driving gear connected to the second guide plate and rotatable based on the fourth driving axis; and an even number of connecting gears configured to connect the first driving gear and the second driving gear.

In various example embodiments, the first support plate, the second support plate, the first slider, the second slider, the first guide plate, and the second guide plate may be configured to move in one degree of freedom.

In various example embodiments, in a state in which the first support plate and the second support plate are parallel with each other, the first slider and the second slider may be disposed in parallel, and in a state in which the first support plate is aligned with the second support plate, the first slider may be aligned with the second slider.

In various example embodiments, the electronic device may further include: a guide cam configured to move the first slider with respect to the first support plate by pressing the first slider based on the first support plate rotating.

In various example embodiments, a length of a portion, of the guide cam, protruding from the first rotation axis toward a first direction may be different than a length of a portion, of the guide cam, protruding from the first rotation axis toward a second direction intersecting with the first direction.

According to various example embodiments, a foldable electronic device configured to move a flexible printed circuit board (FPCB) along a support plate during an unfolding operation may include: a hinge body configured to support the FPCB, wherein a hinge may include: the hinge body; a support plate rotatably connected to the hinge body; a slider slidable along the support plate and configured to support the FPCB; and a connecting part connecting the support plate and the connecting plate.

In various example embodiments, based on the first support plate rotating, a distance between the slider and a rotation axis of the support plate may decrease.

In various example embodiments, the first connecting part may include: a connecting body connected to any one of the first support plate and the first slider, and a connecting guide provided at the other one of the first support plate and the first slider and configured to accommodate the connecting body.

In various example embodiments, the electronic device may further include: a guide plate rotatably connected to the hinge body and configured to support the slider, and a rotation axis of the guide plate may be provided at a location apart from the rotation axis of the support plate.

According to various example embodiments, a foldable electronic device configured to move a flexible printed circuit board (FPCB) along the support plate during an unfolding operation may include: a hinge; a first housing and a second housing rotatably connected to the hinge; a display disposed on the first housing and the second housing and deformable based on movement of the first housing and the second housing; the FPCB provided at an inside of the first housing and the second housing, wherein the hinge may include: a hinge body; a first support plate rotatably connected to the hinge body based on a first rotation axis, and connected to the first housing; a second support plate rotatably connected to the hinge body based on the second rotation axis, and connected to the second housing; a first slider slidable along the first support plate and configured to support one side of the FPCB; a second slider slidable along the second support plate and configured to support the other side of the FPCB; a first connecting part configured to connect the first support plate and the first slider; a second connecting part configured to connect the second support plate and the second slider; a first guide plate rotatably connected to the hinge body based on a third rotation axis and configured to support the first slider; and a second guide plate rotatably connected to the hinge body based on a fourth rotation axis and configured to support the second slider.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. A foldable electronic device configured to move a flexible printed circuit board along a support plate during an unfolding operation, the electronic device comprising:
   a hinge;
   a first housing and a second housing rotatably connected to the hinge;
   a display disposed in the first housing and the second housing and deformable based on movement of the first housing and the second housing; and
   the flexible printed circuit board provided at an inside of the first housing and the second housing,
   wherein the hinge comprises:
   a hinge body;
   a pair of first support plates connected to the first housing and rotatably connected to the hinge body based on a first rotation axis;
   a pair of second support plates connected to the second housing and rotatably connected to the hinge body based on a second rotation axis;
   a first slider positioned between the pair of first support plates, slidable along the first support plate and configured to support one side of the flexible printed circuit board;
   a second slider positioned between the pair of second support plates, slidable along the second support plate and configured to support the other side of the flexible printed circuit board;
   a first circuit board disposed on the first slider; and
   a second circuit board disposed on the second slider;
   wherein the flexible printed circuit board is connected to the first circuit board and the second circuit board.

2. The electronic device of claim 1, wherein a distance between the first slider and the first rotation axis changes based on the first support plate rotating.

3. The electronic device of claim 1, wherein the first slider is configured to move along the first support plate in a direction of increasing distance from the first rotation axis, based on the first support plate rotating in a direction in which an angle between the first support plate and the second support plate increases.

4. The electronic device of claim 1, wherein the first slider is rotatably connected to the hinge body based on a third rotation axis parallel with the first rotation axis and spaced apart from the first rotation axis.

5. The electronic device of claim 4, wherein a distance between the third rotation axis and the first rotation axis is greater than a distance between the third rotation axis and the second rotation axis.

6. The electronic device of claim 1, wherein the hinge further comprises:
   a first connecting part configured to connect the first support plate to the first slider; and
   a second connecting part configured to connect the second support plate to the second slider.

7. The electronic device of claim 6, wherein the first support plate and the first slider are movable in one degree of freedom, and the second support plate and the second slider are movable in the one degree of freedom.

8. The electronic device of claim 6, wherein the first connecting part comprises: a connecting body connected to any one of the first support plate and the first slider, and a connecting guide provided in the other one of the first support plate and the first slider and configured to accommodate the connecting body.

9. The electronic device of claim 8, wherein the connecting body is configured to move along the connecting guide in a direction of increasing distance from the first rotation axis, based on the first support plate rotating in a direction in which an angle between the first support plate and the second support plate increases.

10. The electronic device of claim 1, further comprising:

a first guide plate rotatably connected to the hinge body based on a third rotation axis and configured to support the first slider;

a second guide plate rotatably connected to the hinge body based on a fourth rotation axis and configured to support the second slider.

11. The electronic device of claim 10, further comprising:
a first driving gear connected to the first guide plate and rotatable based on the third rotation axis;
a second driving gear connected to the second guide plate and rotatable based on the fourth rotation axis; and
an even number of connecting gears configured to connect the first driving gear to the second driving gear.

12. The electronic device of claim 10, wherein the first support plate, the second support plate, the first slider, the second slider, the first guide plate, and the second guide plate are configured to move in one degree of freedom.

13. The electronic device of claim 1, wherein the first slider and the second slider are disposed in parallel with each other in a fully folded state of the electronic device in which the first support plate and the second support plate are parallel with each other, and
the first slider is aligned with the second slider in a fully unfolded state of the electronic device in which the first support plate is aligned with the second support plate.

14. The electronic device of claim 1, further comprising:
a guide cam configured to move the first slider with respect to the first support plate by pressing the first slider based on the first support plate rotating.

15. The electronic device of claim 14, wherein a length of a portion of the guide cam protruding from the first rotation axis toward a first direction is different from a length of a portion of the guide cam protruding from the first rotation axis toward a second direction intersecting with the first direction.

16. A foldable electronic device comprising a hinge supporting a flexible printed circuit board, the electronic device comprising:
a hinge comprising:
a hinge body;
a pair of support plates rotatably connected to the hinge body;
a slider positioned between the pair of support plates, slidable along the support plate and configured to support the flexible printed circuit board;
a connecting part configured to connect the support plate to a connecting plate; and
a first circuit board disposed on the slider, configured to connect the flexible printed circuit board.

17. The electronic device of claim 16, wherein a distance between the slider and a rotation axis of the support plate changes based on the support plate rotating.

18. The electronic device of claim 16, wherein the connecting part comprises: a connecting body connected to any one of the support plate and the slider, and a connecting guide provided in the other one of the support plate and the slider and configured to accommodate the connecting body.

19. The electronic device of claim 16, wherein the hinge further comprises:
a guide plate rotatably connected to the hinge body and configured to support the slider, wherein a rotation axis of the guide plate is provided at a location apart from a rotation axis of the support plate.

20. A foldable electronic device configured to move a flexible printed circuit board along a support plate during an unfolding operation, the electronic device comprising:
a hinge;
a first housing and a second housing rotatably connected to the hinge;
a display disposed in the first housing and the second housing and deformable based on movement of the first housing and the second housing; and
the flexible printed circuit board provided at an inside of the first housing and the second housing,
wherein the hinge comprises:
a hinge body;
a pair of first support plate connected to the first housing and rotatably connected to the hinge body based on a first rotation axis;
a pair of second support plate connected to the second housing and rotatably connected to the hinge body based on a second rotation axis;
a first slider positioned between the pair of first support plates, slidable along the first support plate and configured to support one side of the flexible printed circuit board;
a second slider positioned between the pair of second support plates, slidable along the second support plate and configured to support the other side of the flexible printed circuit board;
a first connecting part configured to connect the first support plate to the first slider;
a second connecting part configured to connect the second support plate to the second slider;
a first guide plate rotatably connected to the hinge body based on a third rotation axis and configured to support the first slider;
a second guide plate rotatably connected to the hinge body based on a fourth rotation axis and configured to support the second slider; and
a first circuit board disposed on the first slider; and
a second circuit board disposed on the second slider;
wherein the flexible printed circuit board is connected to the first circuit board and the second circuit board.

* * * * *